(12) United States Patent
Ben Abdelaziz

(10) Patent No.: US 10,377,305 B2
(45) Date of Patent: Aug. 13, 2019

(54) COMMAND MECHANISM, IN PARTICULAR FOR VEHICLES

(71) Applicant: FAURECIA INTERIEUR INDUSTRIE, Nanterre (FR)

(72) Inventor: Omar Ben Abdelaziz, Beauvais (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 0 days.

(21) Appl. No.: 15/842,789

(22) Filed: Dec. 14, 2017

(65) Prior Publication Data

US 2018/0162273 A1    Jun. 14, 2018

(30) Foreign Application Priority Data

Dec. 14, 2016   (FR) ..................... 16 62449

(51) Int. Cl.
  *G06F 3/041*   (2006.01)
  *B60Q 9/00*    (2006.01)
  *G06F 3/01*    (2006.01)
  *G09B 21/00*   (2006.01)
  (Continued)

(52) U.S. Cl.
  CPC ................ *B60Q 9/00* (2013.01); *B60K 37/06* (2013.01); *B60R 16/02* (2013.01); *G06F 3/016* (2013.01); *G09B 21/003* (2013.01); *H03K 17/952* (2013.01); *B60K 2350/1012* (2013.01); *B60K 2350/1024* (2013.01); *G06F 3/044* (2013.01);
  (Continued)

(58) Field of Classification Search
  CPC .................... G06F 3/016; G06F 3/044; G06F 2203/04101; G06F 2203/04106; B60Q 9/00; G09B 21/003; B60K 37/06; B60K 2350/1012; B60K 2350/1024; B60R 16/02; H03K 17/952; H03K 17/941; H03K 17/955; H03K 2217/96062; H03K 2217/960705; H03K 2217/9651
  See application file for complete search history.

(56) References Cited

U.S. PATENT DOCUMENTS

2006/0001655 A1*  1/2006  Tanabe .................... G06F 3/044
                                                  345/176
2008/0296072 A1*  12/2008 Takashima .............. G06F 3/016
                                                  178/18.01
(Continued)

FOREIGN PATENT DOCUMENTS

DE    102011104419 A1   12/2011
DE    102013210056 A1   12/2014
(Continued)

OTHER PUBLICATIONS

French Search Report for application No. FR1662449, dated Oct. 18, 2017, 2 pages.

*Primary Examiner* — Munear T Akki
(74) *Attorney, Agent, or Firm* — Reising Ethington P.C.

(57) ABSTRACT

A command mechanism for vehicle includes: a support having a contact surface; a detection mechanism configured to detect a finger of a user in command position pressing on the contact surface; and a vibration mechanism that is configured to generate a distant-approach vibration when the detection mechanism detects the presence of the element at the first distance from the contact surface and a more intense, close-approach vibration when the detection mechanism detects the presence of the element at a second distance from the contact surface.

13 Claims, 6 Drawing Sheets

(51) Int. Cl.
   B60R 16/02 (2006.01)
   B60K 37/06 (2006.01)
   H03K 17/95 (2006.01)
   *G06F 3/044* (2006.01)
   *H03K 17/94* (2006.01)
   *H03K 17/955* (2006.01)

(52) U.S. Cl.
   CPC .............. *G06F 2203/04101* (2013.01); *G06F 2203/04106* (2013.01); *H03K 17/941* (2013.01); *H03K 17/955* (2013.01); *H03K 2217/9651* (2013.01); *H03K 2217/96062* (2013.01); *H03K 2217/960705* (2013.01)

(56) References Cited

U.S. PATENT DOCUMENTS

| | | | | |
|---|---|---|---|---|
| 2009/0265670 | A1* | 10/2009 | Kim | G06F 3/04883 715/863 |
| 2011/0134063 | A1* | 6/2011 | Norieda | G06F 1/1624 345/173 |
| 2012/0056838 | A1 | 3/2012 | Harris | |
| 2013/0033366 | A1* | 2/2013 | McDonough | H04M 19/041 340/407.1 |
| 2014/0204045 | A1* | 7/2014 | Komoto | G06F 3/044 345/173 |
| 2015/0205368 | A1* | 7/2015 | Yairi | G06F 3/046 345/173 |
| 2016/0202762 | A1* | 7/2016 | Tomaru | B60R 11/02 345/173 |
| 2017/0168630 | A1* | 6/2017 | Khoshkava | G06F 1/163 |

FOREIGN PATENT DOCUMENTS

| | | |
|---|---|---|
| EP | 2181881 A1 | 5/2010 |
| EP | 1505484 B1 | 8/2012 |
| EP | 2069887 B1 | 11/2012 |
| FR | 2937917 A1 | 5/2010 |
| WO | WO2009028921 A2 | 3/2009 |
| WO | WO/2010112937 A2 | 10/2010 |
| WO | WO2015105906 A2 | 7/2015 |

* cited by examiner

COMMAND MECHANISM, IN PARTICULAR FOR VEHICLES

FIELD OF THE INVENTION

The invention relates to a command mechanism, in particular for vehicles, where the command mechanism provides a command button function intended in particular to activate/deactivate a device.

BACKGROUND

A command mechanism for vehicles is known, in particular from document EP 2,181,881 A1, comprising:

a support having an outside surface, where the outside surface includes a contact surface extending over a command area;

a detection mechanism configured to detect an element, in particular a finger of a user in command position pressing on the contact surface and generating a command when pressing on the contact surface in the command area is detected, and a vibration mechanism configured to generate a vibration.

The detection mechanism is usually called the command button. Such a mechanism sends a haptic feedback to the user, otherwise called tactile feedback, meaning feedback which is intended to be felt by the user through their fingers. This haptic feedback is information serving to reduce the user's attention needed to actuate the command mechanism. There is therefore a lower risk of distracting the user from driving their vehicle. In document EP 2,181,881 A1, haptic feedback is a mechanical vibration and it indicates to the driver that their command has been received.

Additionally, it is also known, in particular from document DE 10 2011/104,419 A1, to provide additional haptic feedback, audible feedback to the user.

SUMMARY

An object of the present invention is to make it even easier to use the command mechanism with less distraction to the driver. Further, autonomous cars will allow a visually deficient person to be alone in a car and to travel. However, it may still be necessary to use at least one command button for activating a system for voice command, gesture control or remote control by camera or the like. The invention also aims to provide a command mechanism which can be used by a visually deficient person.

In accordance with an aspect of the invention, the command mechanism furthermore may have the following characteristics:

the detection mechanism is configured to detect the presence of the element at a first distance from the contact surface and the presence of the element at a second distance from the contact surface where the second distance is nonzero and less than the first distance;

the vibration mechanism is configured generate a distant-approach vibration when the detection mechanism detects the presence of the element at the first distance from the contact surface; and the vibration mechanism is configured generate a close-approach vibration when the detection mechanism detects the presence of the element at the second distance from the contact surface, where the close-approach vibration is more intense than the distant-approach vibration.

Thus, the user by moving their hand near the contact surface is guided toward the contact surface for placing it in command position. Of course, the user can hold in their hand an object, such as a stylus or the like, intended to come in contact with the contact surface. In this case, the object substitutes for the finger intended to come into contact with the contact surface.

According to another aspect of the invention, preferably the contact surface is deformable from a released position to a depressed position, under the action of pressure exerted by the element on the contact surface, and the detection mechanism is configured generate the command signal when the detection mechanism detects the arrival of the element pressing on the contact surface into the depressed position.

Thus, the act of coming into contact with the contact surface and the act of actuating the contact mechanism are distinct actions for the user, which allows the user to fully control the act of actuating the command mechanism. In particular, the user precisely controls the moment of actuating the command mechanism.

According to another aspect of the invention, preferably the detection mechanism is further configured to detect the presence of the element in an intermediate position between the released position and the depressed position, where the command mechanism measures a time of continuous presence of the element in the intermediate position and when the length of continuous presence is greater that of flush time threshold, the vibration mechanism generates a flush vibration.

Thus, without having to look at the command mechanism, the user is informed that they can at any time actuate the command mechanism by exerting pressure and that such an actuation has not been detected.

According to another aspect of the invention, preferably the vibration mechanism is configured to generate a command vibration when the detection mechanism detects the presence of the element in the command position, the command vibration being distinct from the flush vibration.

Thus, the user is informed that their actuation of the command mechanism has been recognized.

According to another aspect of the invention, preferably the vibration mechanism is configured to generate a command vibration when the detection mechanism detects the presence of the element in the command position, the command vibration being distinct from the from the distant-approach vibration and the close-approach vibration.

Thus, the user is informed that their action on the command mechanism has been recognized and the risk of the user confusing this information with the guiding to the contact surface is reduced.

According to another aspect of the invention, preferably the vibration mechanism is configured to generate a first command vibration and a second command vibration where the second command vibration is distinct from the first command vibration and the vibration mechanism is configured to alternately generate the first command vibration and the second command vibration in case of during successive detections of the presence of the element in the command position by the detection mechanism.

Thus, if the command mechanism serves to command running or stopping of a device, the first vibration and the second vibration will correspond to the running state or the stopping state of the device, such that the user identifies the state of the device following their action on the command device.

According to another aspect of the invention, preferably the detection mechanism is configured to detect the presence of the element at at least five different and nonzero approach distances from the contact surface, including the first and second distance, and the vibration mechanism is configured to generate at least five approach vibrations including the distant-approach vibration and the close-approach vibration, each of these five approach vibrations corresponding to one of the at least five approach distances of the element relative to the contact surface.

Thus, guiding of the user towards the contact surface is improved.

According to another aspect of the invention, the five approach vibrations preferably increase in intensity as the distance of the element from the contact surface detected by the detection mechanism is smaller.

According to another aspect of the invention, preferably the detection mechanism is configured to detect the presence of the element and its distance relative to the contact surface continuously between the first distance and the second distance, and the vibration mechanism is configured to generate a vibration whose intensity increases continuously from the distant-approach vibration to the close-approach vibration.

According to another aspect of the invention, the vibration mechanism is configured to generate the close-approach vibration and the distant-approach vibration with respective vibrational power, the vibrational power of the vibration mechanism during close-approach vibration is preferably greater than the vibrational power of the vibration mechanism during the distant-approach vibration.

Thus, the vibration felt by the user get stronger as the user approaches the contact surface, in that way guiding them towards the contact surface.

According to yet another aspect of the invention, preferably the vibration mechanism is configured to generate, included in the distant-approach vibration, a first alternating sequence of vibration periods having first vibration lengths (preferably vibration periods being either a short vibration period having a first short vibration length or a long vibration period having a long vibration length) and periods without vibration having a first spacing length, the vibration mechanism is configured to generate, included in the close-approach vibration, a second sequence comprising vibration periods having second vibration lengths and periods without vibration having a second spacing length, and the close-approach vibration is distinguished from the distant-approach vibration in that:

the second vibration lengths are greater than the first vibration lengths, and/or the second spacing length is less than the first spacing length, or the second vibration lengths and the second spacing length are respectively reduced compared to the first vibration length and the second spacing length for a single coefficient.

In that way the user clearly feels that the close-approach vibration is more intense than the distant-approach vibration, which effectively guides them towards the contact surface.

Preferably, the command mechanism furthermore has the following characteristics:

the contact surface of the support comprises a first contact surface extending in a first command area and a second contact surface extending in a second command area;

the detection mechanism comprises a first detection mechanism and a second detection mechanism;

the first detection mechanism is configured to:

detect the presence of the element in the first command area at the first distance from the first contact surface;

detect the presence of the element in the first command area at the second distance from the first contact surface; and detect the presence of the element in the command position pressing on the first contact surface and to generate a first command signal when pressing on the first contact surface is detected;

the vibration mechanism is configured to generate a first distant-approach vibration when the detection mechanism detects the presence of the element at the first distance from the first contact surface; and the vibration mechanism is configured to generate a first close-approach vibration when the detection mechanism detects the presence of the element at the second distance from the first contact surface;

the second detection mechanism is configured to:

detect the presence of the element in the second command area at the first distance from the second contact surface;

detect the presence of the element in the second command area at the second distance from the second contact surface; and detect the presence of the element in the command position pressing on the second contact surface and to generate a second command signal when pressing on the second contact surface is detected;

the vibration mechanism is configured to generate a second distant-approach vibration when the second detection mechanism detects the presence of the element at the first distance from the second contact surface; and the vibration mechanism is configured to generate a second close-approach vibration when the second detection mechanism detects the presence of the element at the second distance from the second contact surface;

In that way, a plurality of devices, in particular two devices, can be commanded by the command mechanism, and the user distinguishes each of the command areas corresponding to each of the devices that they can command, without requiring their visual attention, and does so while the user approaches the contact surface, in other words before commanding the device. In that way, the user commanding a different device than the desired one is avoided.

According to an additional aspect of the invention, preferably the vibration mechanism is configured to generate a first command vibration when the first detection mechanism detects the presence of the element in the command position pressing on the first contact surface, the vibration mechanism is configured to generate a second command vibration when the second detection mechanism detects the presence of the element in the command position pressing on the second contact surface, and the first command vibration is identical to the second command vibration.

Thus, the "vibrational language" used by the command mechanism for communicating information to the user is simplified, in that way allowing the user to better understand the action that the user performed because of the vibrational mechanism.

According to another additional aspect of the invention, preferably the first close-approach vibration corresponds to the first distant-approach vibration, except that the vibration mechanism is configured to generate the first close-approach vibration having a vibrational power increased by a closeness coefficient with respect to a vibrational power of the first distant-approach vibration, and the second close-approach vibration corresponds to the second distant-approach vibration, except that the vibration mechanism is configured to generate the second close-approach vibration having a vibrational power increased by the closeness coefficient with respect to a vibrational power of the second distant-approach vibration.

Thus, the user easily understands that the user has not changed command area while getting closer to the outside surface.

According to an another additional aspect of the invention, preferably the first distant-approach vibration includes a first alternating sequence of vibration periods and periods without vibration of given respective length (preferably short vibration periods, long vibration periods and periods without vibration in a set order), the second distant-approach vibration includes a second alternating sequence of vibration periods and periods without vibration having the same respective length (preferably short vibration periods, long vibration periods and periods without vibration in a set order) as the first distant-approach vibration, and the second sequence is different from the first sequence.

The fact of generating different sequences alternating vibrations and absence of vibration (preferably alternating sequences of short vibration period or long vibration period and periods without vibration in a set order) for various contacts zones allows the user to easily determine the command area in which they are located.

According to another aspect of the invention, preferably the distant-approach vibration has a distant-approach vibration frequency, the close-approach vibration has a close-approach vibration frequency, and the distant-approach vibration frequency is identical to the close-approach vibration frequency.

In that way, the vibration mechanism is simplified and the user does not need to detect frequency variations for identifying the command area in which they are located.

According to another aspect of the invention, preferably the command mechanism includes an inductive sensor able to detect the presence of the element both at the first distance from the contact surface, at the second distance from the contact surface and in the command position.

With such a sensor, the distance between the sensor and the finger of the user or an object held by the user can be easily determined through the support.

In various embodiments of the command mechanism, one and/or the other of the following arrangements could additionally be used:

the vibration generator is configured to generate a sonic vibration;

the vibration mechanism comprises an eccentric motor, a solenoid (linear activator which comes to tap on the support), and a piezoelectric or surface exciter (which can create a localized vibration by using a plurality of surface exciters);

the vibration mechanism comprises a plurality of ultrasonic transducers focusing the vibration near the contact surface.

BRIEF DESCRIPTION OF THE FIGURES

Other characteristics and advantages of the present invention will emerge from the following detailed description referring to the attached drawings in which.

DETAILED DESCRIPTION

Figure 1:
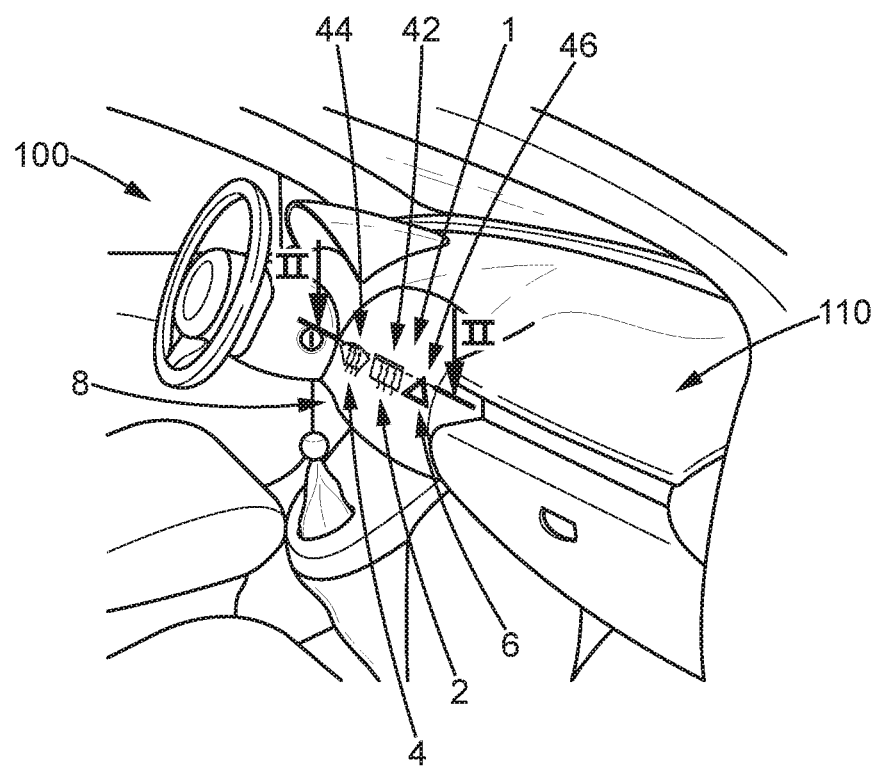
FIG. 1 illustrates a command mechanism according to an embodiment of the invention, integrated in a central console of the dashboard.

FIGS. 1 to 5 show a command mechanism 1 positioned in a vehicle cabin 100 and incorporated in a dashboard 110, more precisely a central console 8 of the dashboard 110.

The central console 8 incorporates a support for the command mechanism 1. In the embodiment shown, the central console 8 comprises a rigid body 18 covered by an elastically deformable covering 10. The rigid body 18 substantially constitutes a plate; it has a front surface and a rear surface. The covering 10 has a rear surface by which it is attached to the front surface of the rigid body 18 and a front surface constituting an outer surface 11 of the support 8.

The command mechanism 1 includes a first command area 2, a second command area 4 and a third command area 6.

There is a first hollow 13 in the first command area 2, a second hollow 15 in the second command area 4 and a third hollow 17 in the third command area 6 on the front surface of the rigid body 18. The first hollow 13, the second hollow 15 and the third hollow 17 make it easier to deform the covering 10 between a released position and a depressed position when a deep press is exerted respectively on a first contact surface 12, a second contact surface 14 and a third contact surface 16.

Advantageously the rigid body 18 is made of rigid plastic and the covering 10 is advantageously constituted by an elastically deformable plate of a few tens of millimeters of aluminum, carbon, wood, plastic, leather or the like.

The outer surface 11 comprises the first contact surface 12 extending in the first command area 2, the second contact surface 14 extending in the second command area 4 and the third contact surface 16 extending in the third contact area 6. Projections 19 on the outer surface 11 extend advantageously between the first command area 2, the second command area 4 and the third command area 6 so that the user can feel by touch a separation between each of these areas.

As shown in FIG. 1, in the embodiment shown, a first pictogram 42 appears on the first contact surface 12, a second pictogram 44 appears on the second contact surface 14 and a third pictogram 46 appears on the third contact surface 16. Advantageously, first pictogram 42, second pictogram 44 and third pictogram 46 are only visible when the device corresponding to the pictogram is activated. In the embodiment shown, as a nonlimiting example, first pictogram 42 represents a rear window defrosting system, second pictogram 44 represents a windshield defogging system and the third pictogram 46 represents hazard lights.

Beyond the support formed by the central console 8 in the embodiment shown, command mechanism 1 includes a detection assembly 20 and a vibration mechanism 30.

The detection assembly 20 includes a first detection mechanism 22 arranged in the first command area 2, a second detection mechanism 24 arranged in the second command area 4 and a third detection mechanism 26 arranged in the third command area 6. In the embodiment shown, the first detection mechanism 22, second detection mechanism 24 and third detection device 26 are borne on a film 28 and attached onto the rear surface of the rigid body 18. Just the same, it would be possible to attach them onto the front surface of the rigid body 18, in particular respectively at the back of the first hollow 13, second hollow 15 and third hollow 17.

In the embodiment shown, the first detection mechanism 22, second detection mechanism 24 and third detection device 26 each comprise an inductive sensor comprising two electrodes 22a, 22b; 24a, 24b; 26a, 26b. In a variant, the inductive sensor could be replaced by an infrared sensor or any other similar sensor able to detect a distance. As is well known, the presence of an object, in particular a finger 50 changes the electrical signal between the capacitive sensor electrodes.

Figure 5:
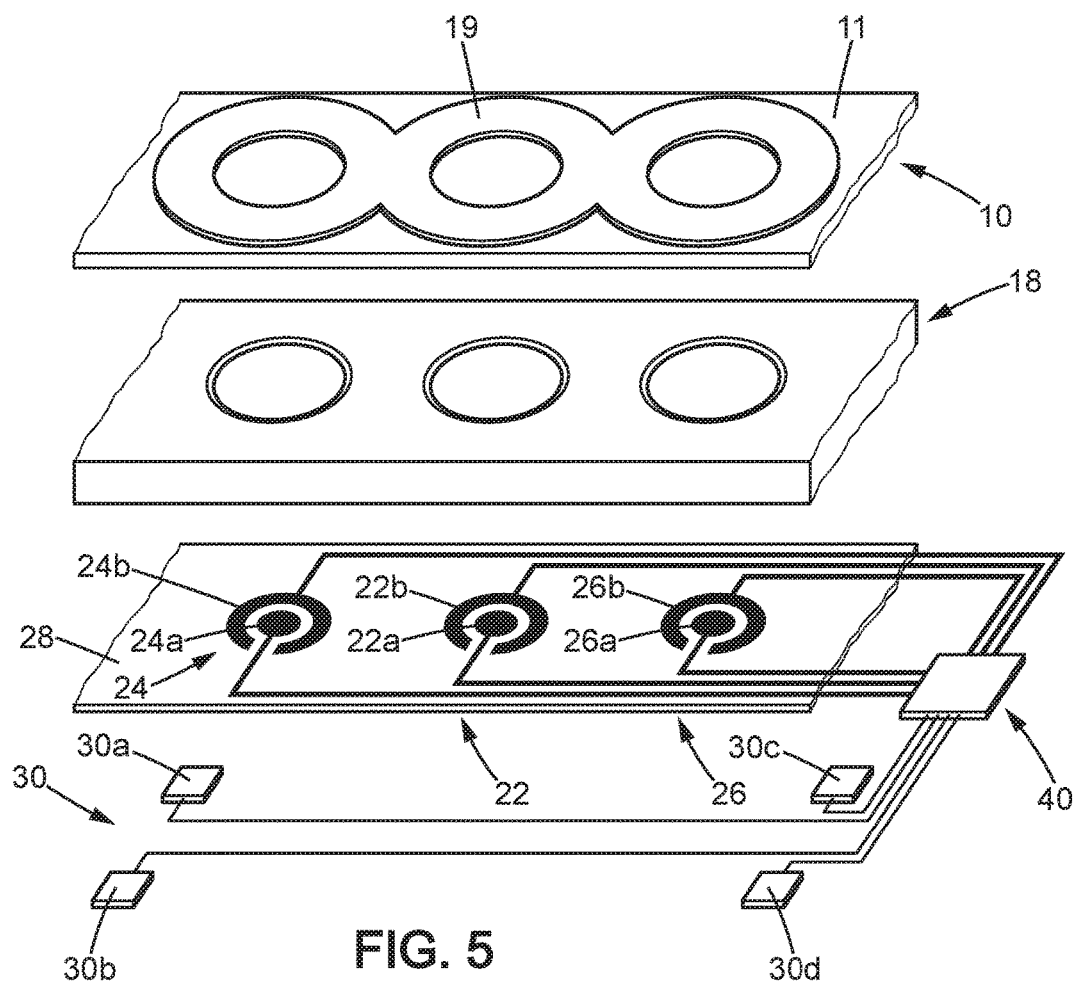
FIG. 5 is an exploded perspective schematic representation of the command mechanism.

As shown in FIG. 5 in the embodiment shown, the vibration mechanism 30 includes four elements 30a, 30b, 30c, 30d made up of ultrasonic transducers. The presence of four elements serves to focus a vibrational wave in the first command area 2, in the second command area 4 or in the third command area 6. In the embodiment shown, since first command area 2, second command area 4 and third command area 6 are aligned, it would all the same be possible to use only two ultrasound transducers for focusing the vibrational wave in the first command area 2, in the second command area 4 or in the third command area 6.

As a variant, three elements arranged in each of the command areas 2, 4, 6 could also be used. In this case, each element could be made up of an eccentric motor, a solenoid, a piezoelectric element, a surface exciter or the like. The solenoid or piezoelectric element forms an actuator coming to tap against the support 8. A surface exciter is in particular described in the document WO 2010/112,937 to which one can refer for a more detailed description.

The command mechanism 1 further comprises one electronic command unit 40 to which the detection mechanism 20 and the vibration mechanism 30 are connected. As a variant, the detection mechanism 20 and the vibration mechanism 30 could each incorporate an electronic command unit, such that the detection mechanism 20 and the vibration mechanism 30 could then be connected directly to each other.

In the remainder of the description, it will be considered that the user of the command mechanism 1 acts by using one of their fingers. The user could however act by means of a stylus or the like held in their hand.

When the user brings their finger 50 toward the first contact surface 12, the first detection mechanism 22 detects the distance between the finger 50 and the first contact surface 12 and sends the corresponding signal to the electronic command unit 40.

Figure 2:
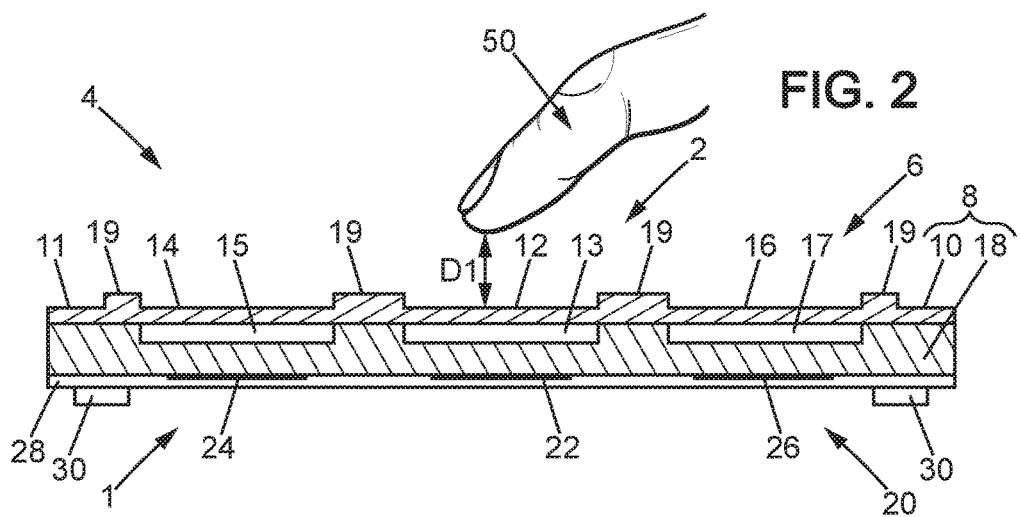
FIG. 2 illustrates the command mechanism in section along the line II-II referenced in FIG. 1 with the finger of the user at a first distance from a first contact surface.
Figure 3:
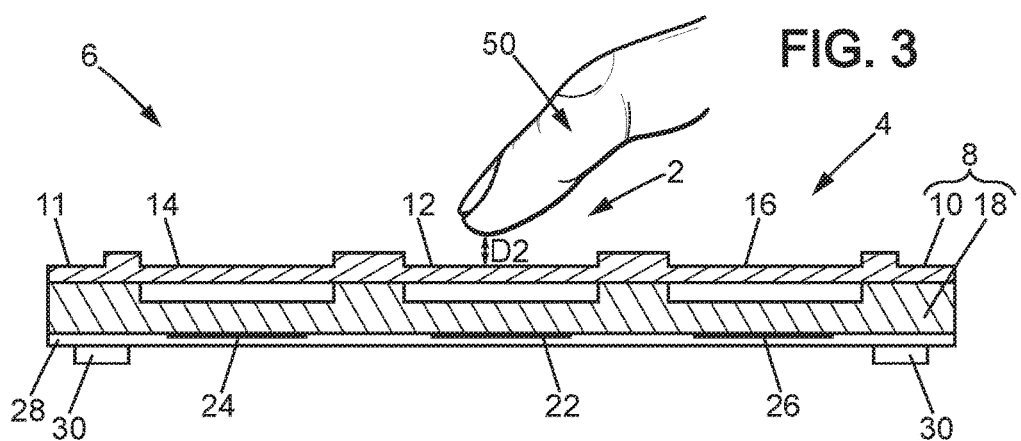
FIG. 3 illustrates the command mechanism according to FIG. 2 with the finger of the user at a second distance from the first contact surface.
Figure 4:
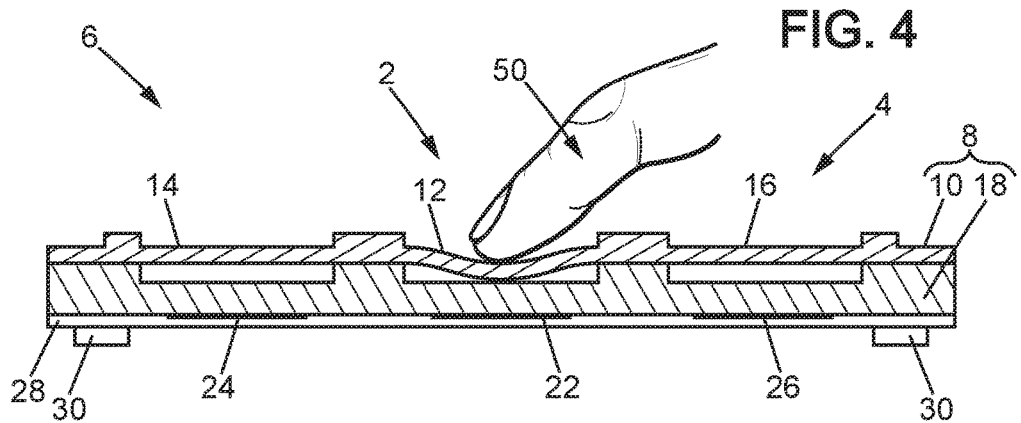
FIG. 4 illustrates the command mechanism according to FIG. 2 with the finger of the user pressing deeply on the first contact surface.

When the distance between the finger 50 and the first contact surface 12 detected by the first detection mechanism 22 is equal to a first distance D1, as shown in FIG. 2, the electronic command unit 40 commands a vibration mechanism 30 to generate a first distant-approach vibration 31.

When the user continues to bring their finger 50 closer to the first contact surface 12, the first detection mechanism 22 detects this movement and sends the electronic command unit 40 a signal varying according to the distance between the finger 50 and the first contact surface 12. When the distance between the finger 50 and the first contact surface 12 detected by the first detection mechanism 22 is equal to a second distance D2, as shown in FIG. 2, the electronic command unit 40 commands the vibration mechanism 30 to generate a first close-approach vibration 32.

The finger 50 of the user then comes to press on the first contact surface 12. By exerting pressure on the first contact surface 12, the finger 50 deforms the first contact surface 12 between a released position shown in FIGS. 2 and 3 in the depressed position shown in FIG. 4.

Because the first detection mechanism 22 continues to send the electronic command unit 40 a signal that is a function of the distance separating it from the finger 50, the electronic command unit 40 knows the position of the finger 50 when it deforms the first contact surface 12 between the released position and the depressed position.

When the finger 50 pressing on the first contact surface 12 is at a distance from the first detection mechanism 22 corresponding to the depressed position of the first contact surface 12, the electronic command unit 40 commands the vibration mechanism 30 to generate a first command vibration 37. Additionally, the electronic command unit 40 then advantageously issues a first command signal commanding starting of the device corresponding to the first command area 2, specifically the rear window deicing system, and the electronic command unit 40 commands a light making the corresponding pictogram 42 appear on the outer surface 11 of the central console 8.

When the user withdraws their finger from the first contact surface 12 and then again presses their finger 50 deeply on the first contact surface 12 until bringing it into the depressed position, the electronic command unit 40 commands the vibration mechanism 30 to generate a second command vibration 38. Additionally, the electronic command unit 40 then advantageously issues a second command signal commanding stopping of the rear window deicing system and the electronic for command unit 40 commands turning off the lighting of the first pictogram 42.

If the user leaves their finger 50 in an intermediate position, resting lightly on the first contact surface 12 without bringing the first contact surface 12 into the depressed position, for a time longer than a flush time threshold, the electronic command unit commands the vibration mechanism 30 to generate a flush vibration 39.

Similarly, when the user places their finger in the second command area 4, the electronic command unit 40 commands the vibration mechanism 30 to generate a second distant-approach vibration 33 when the distance between the finger 50 and the second contact surface 14 detected by the second detection mechanism 24 is equal to the first distance D1. When the distance between the finger 50 and the second contact surface 14 detected by the second detection mechanism 24 is equal to the second distance D2, the electronic command unit 40 commands the vibration mechanism 30 to generate a second close-approach vibration. When the user presses their finger 50 on the second contact surface 14 bringing it into depressed position, the electronic command unit 40 commands the vibration mechanism 30 to generate the first command vibration 37. The electronic command unit 40 then commands additionally starting the windshield defogger system and the electronic command unit 40 commands a light making the second pictogram 44 appear on the outer surface 11 of the central console 8. When the user again presses their finger 50 deeply on the second contact surface 14 bringing it into the depressed position, the electronic command unit 40 commands the vibration mechanism 30 to generate the second command vibration 38, commands stopping the windshield defogging system and turning off lighting of the second pictogram 44. If the user leaves their finger 50 in an intermediate position, resting on the second contact surface 14 for a time longer than the flush time threshold, the electronic command unit commands the vibration mechanism 30 to generate the flush vibration 39.

Finally, when the user places their finger in the third command area 4, the electronic command unit 40 commands the vibration mechanism 30 to generate a third distant-approach vibration 35 when the distance between the finger 50 and the third contact surface 16 detected by the third detection mechanism 26 is equal to the first distance D1. When the distance between the finger 50 and the third contact surface 16 detected by the third detection mechanism 26 is equal to the third distance D2, the electronic command unit 40 commands the vibration mechanism 30 to generate a third close-approach vibration. When the user presses their finger 50 deeply on the third contact surface 16 bringing it into depressed position, the electronic command unit 40 commands the vibration mechanism 30 to generate the first command vibration 37. The electronic command unit 40 additionally commands starting the hazard lights and the electronic command unit 40 commands a light making the third pictogram 46 appear on the outer surface 11 of the central console 8. When the user again presses their finger 50 deeply on the third contact surface 16 bringing it into the depressed position, the electronic command unit 40 commands the vibration mechanism 30 to generate the second command vibration 38, commands stopping the hazard lights and turning off lighting of the second pictogram 46. If the user leaves their finger 50 in an intermediate position, resting on the third contact surface 14 for a time longer than the flush time threshold, the electronic command unit commands the vibration mechanism 30 to generate the flush vibration 39.

The variation between the first distant-approach vibration 31 and the first close-approach vibration 32 is chosen for guiding the user towards the first contact surface. In particular, the first close-approach vibration 32 is more intense than the first approach vibration 31.

In a first embodiment, the vibrational power P generated by the vibration mechanism 30 in the area of the finger 50 in the case of the first close-approach vibration 32 is greater than the vibration power generated by the vibration mechanism 30 in the case of the first distant-approach vibration 31. More precisely, the first close-approach vibration 32 corresponds to the first distant-approach vibration 31, except that the vibrational power near the finger 50 is increased by a coefficient equal to $L_2/L_1$. Preferably, the vibrational frequency of the first close-approach vibration 32 is identical to the vibrational frequency of the first distant-approach vibration 31.

Advantageously, the vibration mechanism 30 generates an approach vibration whose vibrational power increases as a function of the finger coming closer to the first contact surface 12. The vibrational power near the finger 50 as a function of the finger 50 approaching the first contact surface 12, detected by the first detection mechanism 22, can increase by thresholds, preferably at least five thresholds, or continuously. This is particularly advantageous in the case where the approach vibration consists of a continuous vibration. The vibrational power near the finger 50 as a function of the finger 50 approaching the first contact surface 12 can be increased, in the case where the vibration mechanism 30 comprises ultrasonic transducers, by focusing of the ultrasound waves behind the outer surface 11 (around the rigid body 18).

The vibrational power as a function of the finger 50 approaching the outer surface 11 described in relation with the first command area 2 applies identically to the second command area 4 and the third command area 6.

In the embodiment shown in FIGS. 6 to 13, the vibrations generated by the vibration mechanism 30 comprise sequences alternating a short vibration period $V_C$ or long vibration period $V_L$ with a period without vibration $V_0$. These sequences are characteristics of the first command area 2, of the second command area 4 and the third command area 6.

Figure 6:
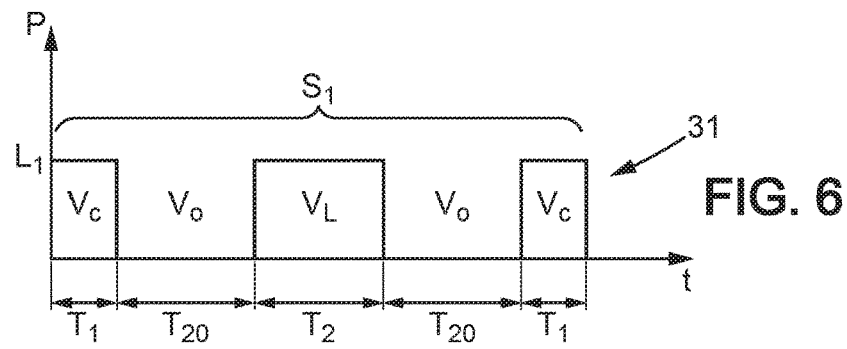
FIG. 6 illustrates variations of vibrational power generated by a vibrating mechanism as a function of time, when the finger of the user is at the first distance from the first contact surface.
Figure 7:
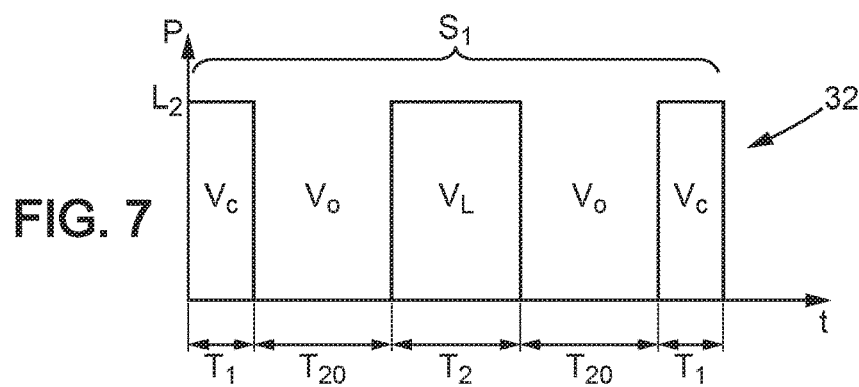
FIG. 7 illustrates variations of vibrational power generated by the vibrating mechanism as a function of time, when the finger of the user is at the second distance from the first contact surface.

Thus, as shown in FIGS. 6 and 7, the first distant-approach vibration 31 and the first close-approach vibration 32 include a sequence $S_1$ in which a short vibration period $V_C$, a period without vibration $V_0$, a long vibration period $V_L$, a period without vibration $V_0$ and a short vibration period $V_C$ follow one after the other. When the user feels this sequence $S_1$ while their finger 50 is at the first distance $D_1$ from the first contact surface 12, the user knows that it is in the first command area 2. When their finger is at the second distance $D_2$, the user knows by the increase of the vibrational power that it is at the second distance $D_2$ from the outer surface and, if the sequence is the same, they know that their finger is still in the first command area 2 or if the sequence has changed they know that their finger has moved to the second command area 4 or the third command area 6.

Preferably the length $T_2$ of the long vibration period $V_L$ is twice the length $T_1$ of the short vibration period $V_C$ and the length $T_{20}$ of the period without vibration $V_0$ is equal to the length $T_1$ or the length $T_2$.

The vibrational power P generated by the vibration mechanism 30 both during the short vibration periods $V_C$ and during the long vibration period $V_L$ of the first distant-approach vibration 31 is constant and equal to $L_1$. The vibrational power generated by the vibration mechanism 30 both during the short vibration periods $V_C$ and during the long vibration period $V_L$ of the first close-approach vibration 32 is constant, equal to $L_2$ and greater than $L_1$. The vibrational power P generated by the vibration mechanism 30 both during the periods without vibration $V_0$ from the first distant-approach vibration 31 and during the first close-approach vibration 32 is zero.

Figure 11:
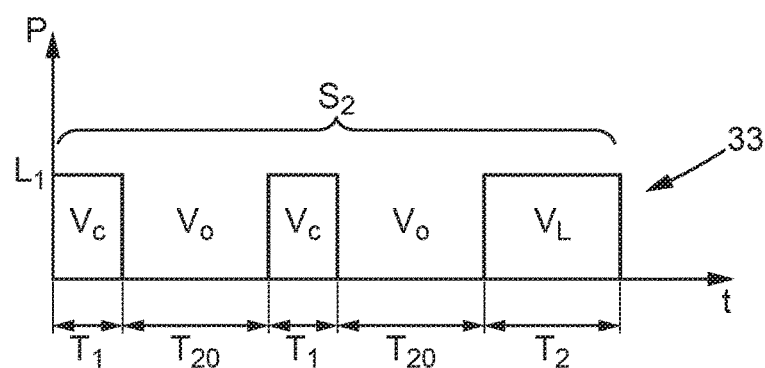
FIG. 11 illustrates variations of vibrational power generated by the vibrating mechanism as a function of time, when the finger of the user is at the first distance from the second contact surface.

Thus, as shown in FIG. 11, the second distant-approach vibration 33 and the second close-approach vibration include a sequence $S_2$ in which a short vibration period $V_C$, a period without vibration $V_0$, a short vibration period $V_C$, a period without vibration $V_0$ and a long vibration period $V_L$ follow one after the other. When the user feels this sequence $S_2$, the user knows that they are in the second command area 4.

Further, since the vibrational power P generated by the vibration mechanism 30 both during the short vibration periods $V_C$ and during the long vibration period $V_L$ of the second distant-approach vibration 33 is constant and equal to $L_1$, the user knows that they are at the first distance $D_1$ from the outer surface 11.

The vibrational power P generated by the vibration mechanism 30 both during the short vibration periods $V_C$ and during the long vibration period $V_L$ of the second close-approach vibration is constant and equal to $L_2$.

Consequently, when the finger 50 is at the second distance $D_2$, the user knows by the increase of the vibrational power felt by their finger 50 that it is at the second distance $D_2$ from the outer surface 11 and, if the sequence is the same, they know that their finger 50 is still in the second command area 4 or if the sequence is that of the first command area 2, they know that their finger has moved into the first command area 2.

Figure 12:
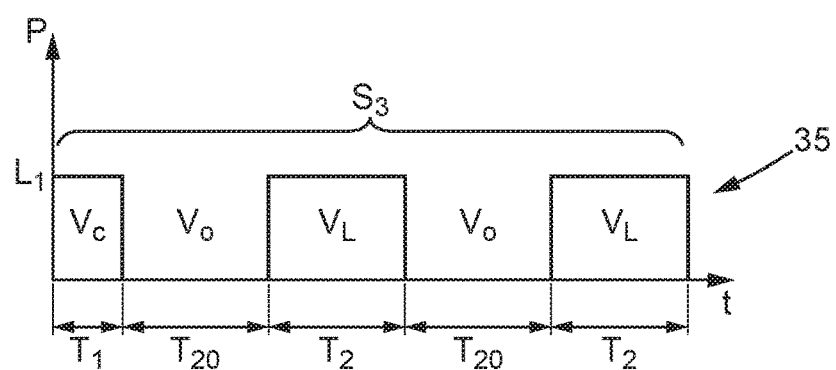
FIG. 12 illustrates variations of vibrational power of a vibrating mechanism as a function of time, when the finger of the user is at the first distance from the third contact surface.

Thus, as shown in FIG. 12, the third distant-approach vibration 35 and the third close-approach vibration include a sequence $S_3$ in which a short vibration period $V_C$, a period without vibration $V_0$, a long vibration period $V_L$, a period without vibration $V_0$ and a long vibration period $V_L$ follow one after the other. When the user feels this sequence $S_3$, the user knows that they are in the third command area 6.

Further, since the vibrational power felt by their finger 50 both during the short vibration periods $V_C$ and during the long vibration period $V_L$ of the third distant-approach vibration 35 is constant and equal to $L_1$ the user knows that they are at the first distance $D_1$ from the outer surface 11.

The vibrational power P generated by the vibration mechanism 30 both during the short vibration periods $V_C$ and during the long vibration period $V_L$ of the second close-approach vibration is constant and equal to $L_2$.

Consequently, when their finger 50 is at the second distance $D_2$, the user knows by the increase of the vibrational power felt by their finger 50 that it is at the second distance $D_2$ from the outer surface 11 and, if the sequence is the same, they know that their finger is still in the third command area 6 or if the sequence has changed they know how to identify from the sequence whether their finger has moved to the first command area 2 or the second command area 4.

Figure 8:
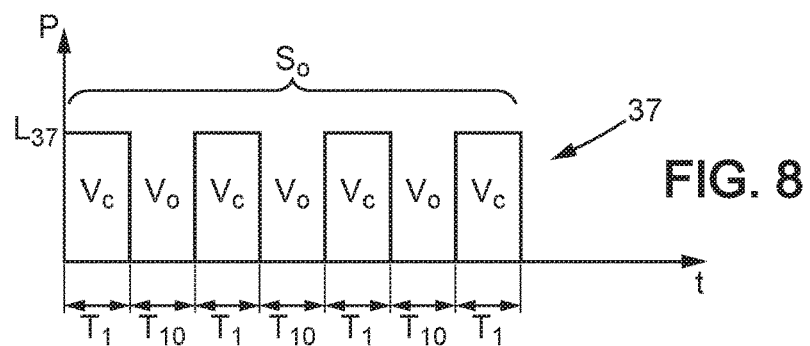
FIG. 8 illustrates variations of vibrational power generated by the vibrating mechanism as a function of time, during a first deep press of the finger on the first contact surface.

As shown in FIG. 8, the first command vibration 37 has its own sequence $S_0$ in which four periods of short vibration $V_C$ and periods without vibration $V_0$ alternate. In the embodiment shown in FIG. 8, the time $T_{10}$ of the period without vibration $V_0$ is equal to the time $T_1$ of the short vibration period $V_C$. Vibrational power P generated by the vibration mechanism 30 during short vibration periods $V_C$ is equal to $L_{37}$.

Figure 9:
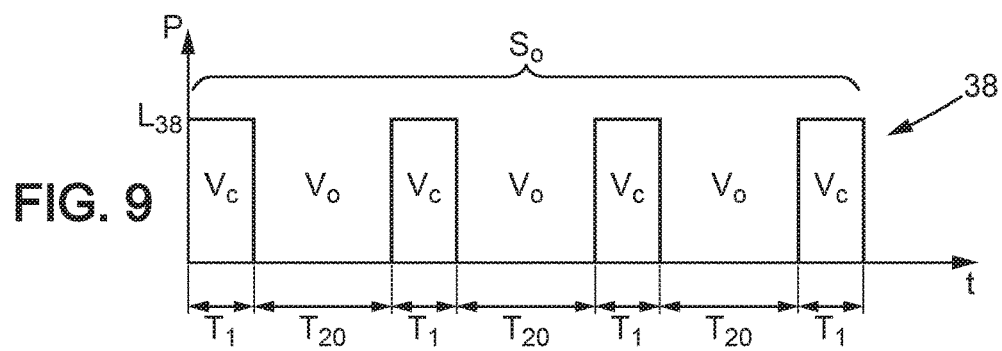
FIG. 9 illustrates variations of vibrational power generated by the vibrating mechanism as a function of time, during the second deep press of the finger on the first contact surface.

As shown in FIG. 9, the second command vibration 38 has the same sequence $S_0$ as the first command vibration 37 in which four periods of short vibration $V_C$ and periods without vibration $V_0$ alternate. But, the time $T_{20}$ of the period without vibration $V_0$ is equal to the time $T_2$ of the long vibration period $V_L$. Vibrational power P generated by the vibration mechanism 30 during short vibration periods $V_C$ is equal to $L_{38}$.

Figure 10:
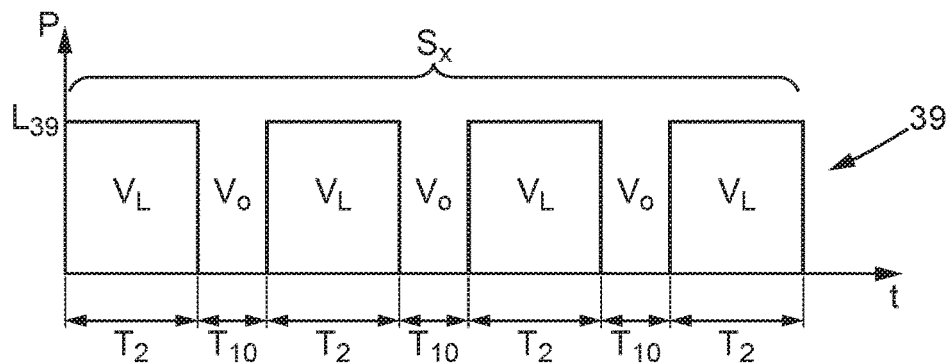
FIG. 10 illustrates variations of vibrational power generated by the vibrating mechanism as a function of time, when the finger of the user is in extended intermediate pressing on the first contact surface.

As shown in FIG. 10, the flush vibration 39 has its own sequence $S_X$ in which four periods of long vibration $V_L$ and periods without vibration $V_0$ alternate. In the embodiment shown in FIG. 10, the time $T_{10}$ of the period without vibration $V_0$ is equal to twice the time $T_2$ of the long vibration period $V_L$. Vibrational power P generated by the vibration mechanism 30 during long vibration periods $V_L$ is equal to $L_{39}$.

Figure 13:
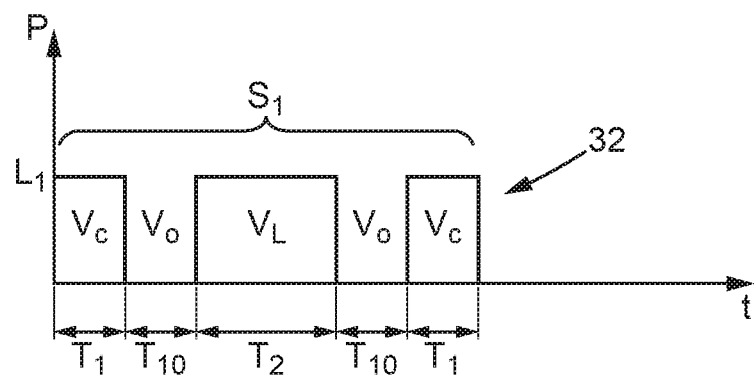
FIG. 13 illustrates variations of vibrational power generated by the vibrating mechanism as a function of time, when the finger of the user is at the second distance from the first contact surface, according to an embodiment variant.

FIG. 13 shows a variant embodiment in which the time $T_{10}$ of the period without vibration $V_0$ of the first close-approach vibration 32 is equal to the time $T_1$ of the short vibration period $V_C$. Consequently, the first close-approach vibration 32 is distinguished from the first distant-approach vibration 31 by a reduction of the length of the period without vibration $V_0$. The vibrational power P generated by the vibration mechanism 30 both during the short vibration periods $V_C$ and during the long vibration period $V_L$ of the first close-approach vibration 32 is preferably constant and equal to $L_1$.

Figure 14:
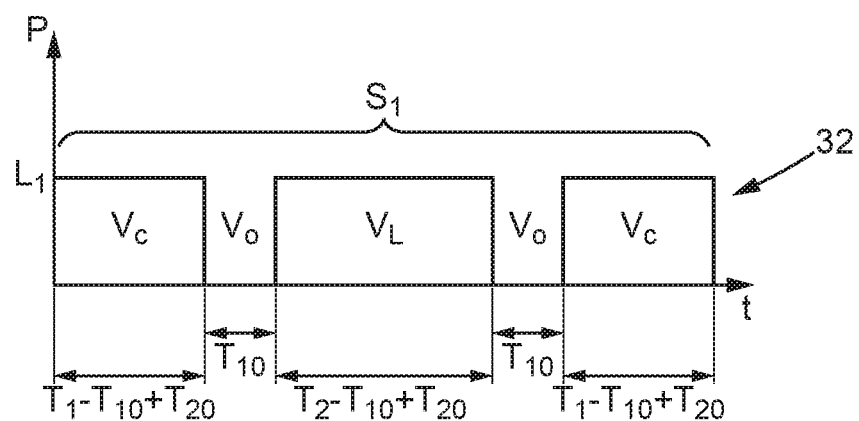
FIG. 14 illustrates variations of vibrational power generated by the vibrating mechanism as a function of time, when the finger of the user is at the second distance from the first contact surface, according to another implementation variant.

FIG. 14 shows another variant embodiment in which both the time $T_{10}$ of the period without vibration $V_0$ of the first close-approach vibration 32 is reduced compared to time $T_{20}$ of the period without vibration $V_0$ of the first distant-approach vibration 31 and also, the length $T_1-T_{10}+T_{20}$ of the short vibration period $V_c$ as well as the length $T_2-T_{10}+T_{20}$ of the long vibration period $V_L$ is increased accordingly. Consequently, the length of the sequence $S_1$ of the first close-approach vibration 32 is the same as the length of the sequence $S_1$ of the first distant-approach vibration 31.

Of course, the invention is in no way limited to the embodiment(s) described for purposes of illustration, without limitation. Thus, in the embodiment shown, the command mechanism 1 is incorporated in the central console 8 of the dashboard. As a variant, the command mechanism could be incorporated in a display screen (in particular LCD display) added to the central console 8.

Additionally, the command mechanism could be arranged elsewhere than on the central console, in particular on a door panel, or more generally arranged elsewhere in a vehicle cabin.

Further, it would be possible that the first close-approach vibration 32 be distinguished from the first distant-approach vibration 31 both by the vibrational power increase felt by the finger 15, as in the embodiment shown in FIG. 7, and by a reduction of the length of the period without vibration $V_0$, as in the embodiment shown in FIG. 13 and/or by an increase of the length of the short-vibration periods $V_C$ and the long-vibration periods $V_L$, as in the embodiment shown in FIG. 14.

The invention claimed is:
1. A command mechanism for a vehicle, comprising:
   a support having an outside surface, where the outside surface includes a contact surface extending over a command area;
   a detector configured to detect an element in a command position pressing on the contact surface and generating a command signal when pressing on the contact surface is detected; and
   a vibration generator configured to generate a vibration;

wherein:
the detector is configured to detect the presence of the element at a first distance from the contact surface and the presence of the element at a second distance from the contact surface, where the second distance is non-zero and less than the first distance;
the vibration generator is configured to generate a distant-approach vibration when the detector detects the presence of the element at the first distance from the contact surface;
the vibration generator is configured to generate a close-approach vibration when the detector detects the presence of the element at the second distance from the contact surface, where the close-approach vibration is more intense than the distant-approach vibration;
the contact surface is deformable from a released position to a depressed position under the action of pressure exerted by the element on the contact surface;
the detector is configured to generate the command signal when the detector detects the arrival of the element pressing on the contact surface into the depressed position;
the detector is further configured to detect the presence of the element in an intermediate position between the released position and the depressed position;
the command mechanism measures a time of continuous presence of the element in the intermediate position; and
the vibration generator is configured to generate a flush vibration when the time of continuous presence is greater than a flush time threshold.

2. The command mechanism according to claim 1 wherein the vibration generator is configured to generate a command vibration when the detector detects the presence of the element in the command position, the command vibration being distinct from the flush vibration.

3. The command mechanism according to claim 1 wherein the vibration generator is configured to generate a command vibration when the detector detects the presence of the element in the command position, the command vibration being distinct from the distant-approach vibration and the close-approach vibration.

4. The command mechanism according to claim 1 wherein:
the vibration generator is configured to generate a first command vibration and a second command vibration where the second command vibration is distinct from the first command vibration; and
the vibration generator is configured to alternately generate the first command vibration and the second command vibration in case of successive detections of the presence of the element in the command position by the detector.

5. The command mechanism according to claim 1 wherein:
the detector is configured to detect the presence of the element at at least five different and nonzero approach distances from the contact surface, including the first and second distances, and
the vibration generator is configured to generate at least five approach vibrations including the distant-approach vibration and the close-approach vibration, each of the at least five approach vibrations corresponding to one of the at least five approach distances of the element relative to the contact surface.

6. The command mechanism according to claim 5 wherein the at least five approach vibrations increase in intensity as the distance of the element from the contact surface detected by the detector decreases.

7. A command mechanism for a vehicle, comprising:
a support having an outside surface, where the outside surface includes a contact surface extending over a command area;
a detector configured to detect an element in a command position pressing on the contact surface and generating a command signal when pressing on the contact surface is detected; and
a vibration generator configured to generate a vibration;
wherein:
the detector is configured to detect the presence of the element at a first distance from the contact surface and the presence of the element at a second distance from the contact surface, where the second distance is non-zero and less than the first distance;
the vibration generator is configured to generate a distant-approach vibration when the detector detects the presence of the element at the first distance from the contact surface;
the vibration generator is configured to generate a close-approach vibration when the detector detects the presence of the element at the second distance from the contact surface, where the close-approach vibration is more intense than the distant-approach vibration;
the vibration generator is configured to generate the close-approach vibration and the distant-approach vibration with respective vibrational power, a vibrational power of the vibration generator during the close-approach vibration being greater than a vibrational power of the vibration generator during the distant-approach vibration;
the vibration generator is configured to generate, as part of the distant-approach vibration, a first sequence comprising vibration periods having first vibration lengths and periods without vibration having a first spacing length;
the vibration generator is configured to generate, as part of the close-approach vibration, a second sequence comprising vibration periods having second vibration lengths and periods without vibration having a second spacing length; and
the close-approach vibration is distinguished from the distant-approach vibration in that:
the second vibration lengths are greater than the first vibration lengths, and/or
the second spacing length is less than the first spacing length; or
the second vibration lengths and the second spacing length are respectively reduced compared to the first vibration length and the second spacing length for a single coefficient.

8. The command mechanism according to claim 1 wherein:
the contact surface of the support comprises a first contact surface extending in a first command area and a second contact surface extending in a second command area;
the detector comprises a first detector and a second detector;
the first detector is configured to:
detect the presence of the element in the first command area at the first distance from the first contact surface;
detect the presence of the element in the first command area at the second distance from the first contact surface; and detect the presence of the element in the command position pressing on the first contact surface and to generate a first command signal when pressing on the first contact surface is detected;

the vibration generator is configured to generate a first distant-approach vibration when the detector detects the presence of the element at the first distance from the first contact surface; and the vibration generator is configured to generate a first close-approach vibration when the detector detects the presence of the element at the second distance from the first contact surface;

the second detector is configured to:

detect the presence of the element in the second command area at the first distance from the second contact surface;

detect the presence of the element in the second command area at the second distance from the second contact surface; and detect the presence of the element in the command position pressing on the second contact surface and to generate a second command signal when pressing on the second contact surface is detected;

the vibration generator is configured to generate a second distant-approach vibration when the second detector detects the presence of the element at the first distance from the second contact surface; and the vibration generator is configured to generate a second close-approach vibration when the second detector detects the presence of the element at the second distance from the second contact surface.

9. The command mechanism according to claim 8 wherein:

the vibration generator is configured to generate a first command vibration when the first detector detects the presence of the element in the command position pressing on the first contact surface;

the vibration generator is configured to generate a second command vibration when the second detector detects the presence of the element in the command position pressing on the second contact surface; and the first command vibration is identical to the second command vibration.

10. The command mechanism according to claim 8:

the first close-approach vibration corresponds to the first distant-approach vibration, except that the vibration generator is configured to generate the first close-approach vibration having a vibrational power increased by a closeness coefficient with respect to a vibrational power of the first distant-approach vibration; and the second close-approach vibration corresponds to the second distant-approach vibration, except that the vibration generator is configured to generate the second close-approach vibration having a vibrational power increased by the closeness coefficient with respect to a vibrational power of the second distant-approach vibration.

11. The command mechanism according to claim 8 wherein:

the first distant-approach vibration includes a first alternating sequence of vibration periods and periods without vibration of given respective length;

the second distant-approach vibration includes a second alternating sequence of vibration periods and periods without vibration having the same respective length as the first distant-approach vibration; and the second sequence is different from the first sequence.

12. The command mechanism according to claim 1 wherein:

the distant-approach vibration has a distant-approach vibration frequency;

the close-approach vibration has a close-approach vibration frequency; and the distant-approach vibration frequency is identical to the close-approach vibration frequency.

13. A command mechanism for a vehicle, comprising:

a support having an outside surface, where the outside surface includes a contact surface extending over a command area, the contact surface of the support comprising a first contact surface extending in a first command area and a second contact surface extending in a second command area;

a detector configured to detect an element in a command position pressing on the contact surface and generating a command signal when pressing on the contact surface is detected;

a vibration generator configured to generate a vibration; wherein:

the detector comprises a first detector and a second detector, the first detector being configured to detect the presence of the element in the first command area at a first distance from the first contact surface, and the second detector being configured to detect the presence of the element in the second command area at the first distance from the second contact surface;

the vibration generator is configured to generate a first distant-approach vibration when the detector detects the presence of the element at the first distance from the first contact surface;

the vibration generator is configured to generate a second distant-approach vibration when the second detector detects the presence of the element at the first distance from the second contact surface;

the first distant-approach vibration includes a first alternating sequence of vibration periods and periods without vibration of given respective length;

the second distant-approach vibration includes a second alternating sequence of vibration periods and periods without vibration having the same respective length as the first distant-approach vibration;

the second sequence is different from the first sequence;

the first detector is configured to detect the presence of the element in the first command area at a second distance from the first contact surface, the second distance is less than the first distance;

the second detector is configured to detect the presence of the element in the second command area at the second distance from the second contact surface, the vibration generator is configured to generate a first close-approach vibration when the detector detects the presence of the element at the second distance from the first contact surface;

the vibration generator is configured to generate a second close-approach vibration when the second detector detects the presence of the element at the second distance from the second contact surface;

the first close-approach vibration corresponds to the first distant-approach vibration, except that the vibration generator is configured to generate the first close-approach vibration having a vibrational power increased by a closeness coefficient with respect to a vibrational power of the first distant-approach vibration; and the second close-approach vibration corresponds to the second distant-approach vibration, except that the vibration generator is configured to generate the second close-approach vibration having a vibrational power increased by the closeness coefficient with respect to a vibrational power of the second distant-approach vibration.

* * * * *